United States Patent
Chen et al.

(10) Patent No.: US 9,572,277 B2
(45) Date of Patent: Feb. 14, 2017

(54) SLIDE RAIL ASSEMBLY

(71) Applicants: KING SLIDE WORKS CO., LTD., Kaohsiung (TW); KING SLIDE TECHNOLOGY CO., LTD., Kaohsiung (TW)

(72) Inventors: Ken-Ching Chen, Kaohsiung (TW); Shun-Ho Yang, Kaohsiung (TW); Cheng-Chieh Weng, Kaohsiung (TW); Chun-Chiang Wang, Kaohsiung (TW)

(73) Assignees: King Slide Works Co., Ltd., Kaohsiung (TW); King Slide Technology Co., Ltd., Kaohsiung (TW)

( * ) Notice: Subject to any disclaimer, the term of this patent is extended or adjusted under 35 U.S.C. 154(b) by 16 days.

(21) Appl. No.: 14/609,536

(22) Filed: Jan. 30, 2015

(65) Prior Publication Data

US 2016/0227666 A1    Aug. 4, 2016

(51) Int. Cl.
*A47F 5/00* (2006.01)
*H05K 7/14* (2006.01)
*H05K 7/18* (2006.01)

(52) U.S. Cl.
CPC ............ *H05K 7/1489* (2013.01); *H05K 7/183* (2013.01)

(58) Field of Classification Search
CPC .............................. H05K 7/1489; H05K 7/183

USPC .............................. 248/298.1, 424, 429, 430
See application file for complete search history.

(56) References Cited

U.S. PATENT DOCUMENTS

| | | | |
|---|---|---|---|
| 6,685,033 B1 | 2/2004 | Baddour et al. | |
| 6,930,886 B2 | 8/2005 | Velez et al. | |
| 7,137,512 B2 | 11/2006 | Nguyen et al. | |
| 7,780,254 B2 * | 8/2010 | Wang | A47B 88/12 108/143 |
| 2001/0040142 A1 * | 11/2001 | Haney | A47B 88/044 211/183 |
| 2010/0007255 A1 * | 1/2010 | Cheng | H05K 7/1489 312/334.44 |
| 2011/0100935 A1 * | 5/2011 | Yang | H05K 7/1489 211/26 |
| 2013/0016928 A1 * | 1/2013 | Chen | A47B 88/10 384/35 |
| 2013/0077218 A1 * | 3/2013 | Zhang | H05K 7/1489 361/679.02 |

\* cited by examiner

*Primary Examiner* — Gwendolyn Baxter
(74) *Attorney, Agent, or Firm* — Rosenberg, Klein & Lee (57) ABSTRACT

A slide rail assembly includes a first rail, a second rail, a third rail, and an extension rail. The second rail can be longitudinally displaced relative to the first rail. The second rail includes a first section and a second section. The third rail is movably connected to the first section of the second rail and can be longitudinally displaced relative to the first rail by the second rail. The extension rail is located at the second section of the second rail.

18 Claims, 10 Drawing Sheets

SLIDE RAIL ASSEMBLY

FIELD OF THE INVENTION

The present invention relates to a slide rail assembly and, more particularly, to a slide rail assembly which is applicable to and can easily pull apart at least two chassis.

BACKGROUND OF THE INVENTION

In a rack-based server system, the chassis of a server is typically mounted with slide rails on both lateral sides in order to be installed on the supporting posts of a rack via the slide rails and their brackets. The slide rails make it easy to pull the server out of the rack for inspection or maintenance. Related slide rail designs are already disclosed in U.S. Pat. Nos. 7,137,512 and 6,930,886, among others. The disclosure of the afore-cited patents is incorporated herein by reference. Nowadays, the various components of a server are modularized to facilitate assembly, disassembly, and maintenance. For example, a main module is provided in a central portion of a server chassis while a hard disk module, a power supply module, and so on are provided at two opposite ends of the chassis. The modules are connected to one another by cables. To detach a certain module (e.g., a hard disk module), cables between the related modules must be disconnected first, which, however, often presents difficulties due to the complexity of the cables, and the limited space, in the chassis, and maintenance is inconvenienced as a result.

SUMMARY OF THE INVENTION

The present invention relates to a slide rail assembly applicable to at least two chassis.

According to one aspect of the present invention, a slide rail assembly includes a first rail, a second rail, a third rail, and an extension rail. The second rail can be longitudinally displaced relative to the first rail. The second rail includes a first section and a second section. The third rail is movably connected to the first section of the second rail and can be longitudinally displaced relative to the first rail by the second rail. The extension rail is located at the second section of the second rail.

Preferably, the slide rail assembly further includes a supporting member connected to the third rail, and the supporting member has at least one engaging section for making engaging contact with the second rail.

Preferably, the second rail further includes a recess, the slide rail assembly further includes a supporting member connected to the third rail, and the supporting member has a pushing portion to be inserted into the recess. Preferably, the pushing portion of the supporting member has a side provided with at least one engaging section for making engaging contact with the recess.

Preferably, the supporting member further has a cushioning portion opposite the pushing portion, and the first rail further includes a rear blocking portion so that, when displaced to a retracted position relative to the first rail, the third rail is pressed against the rear blocking portion of the first rail via the cushioning portion of the supporting member.

Preferably, the first rail further includes a limiting feature so that, when the third rail has been displaced by the second rail to a first predetermined position relative to the first rail, the pushing portion of the supporting member is pressed against the limiting feature of the first rail and thereby retains the third rail at the first predetermined position.

Preferably, the slide rail assembly further includes a supporting member connected to the third rail, and the supporting member has a pair of supporting wings to be pressed against the first rail.

Preferably, the slide rail assembly further includes a base mounted to the first section of the second rail, and the third rail further includes a limiting feature so that, when the second rail has been displaced to a second predetermined position relative to the first rail, the base of the second rail is pressed against the limiting feature of the third rail and thereby retains the second rail at the second predetermined position.

Preferably, the slide rail assembly further includes an engaging member elastically mounted to the first section of the second rail, the engaging member includes at least one engaging projection, and the first rail further includes a front blocking portion. When the second rail has been pulled out relative to the first rail to a certain position, the engaging projection of the engaging member is engaged with the front blocking portion of the first rail.

Preferably, the slide rail assembly further includes an operating member connected to the engaging member, the first section of the second rail has an aperture, and the operating member has an operating portion located at the aperture. By operating the operating portion of the operating member, the engaging projection of the engaging member is disengaged from the first rail.

Preferably, at least one of the operating member and the engaging member further has an inclined projection so that, by operating the operating member, the inclined projection is driven to push the engaging member and thereby disengage the engaging member from the first rail.

Preferably, the slide rail assembly further includes a positioning element for mounting the extension rail to the second section of the second rail so that the second rail can be displaced relative to the first rail via the extension rail.

According to another aspect of the present invention, a slide rail assembly applicable to a first chassis and a second chassis includes a first rail, a second rail, and a third rail. The second rail can be longitudinally displaced relative to the first rail. The second rail includes a first section and a second section. The second section is connected with the second chassis. The second rail can be displaced relative to the first rail by the second chassis. The third rail is movably connected to the first section of the second rail and is mounted with the first chassis. The third rail can be longitudinally displaced relative to the first rail by the second rail.

Preferably, the slide rail assembly further includes an extension rail located at the second section of the second rail, and the second chassis is mounted to the extension rail.

One of the advantageous features of implementing the present invention is that a first chassis and a second chassis can be mounted to two rails of the slide rail assembly respectively.

BRIEF DESCRIPTION OF THE DRAWINGS

The invention as well as a preferred mode of use and the advantages thereof will be best understood by referring to the following detailed description of some illustrative embodiments in conjunction with the accompanying drawings, in which.

DETAILED DESCRIPTION OF THE INVENTION

Figure 1:
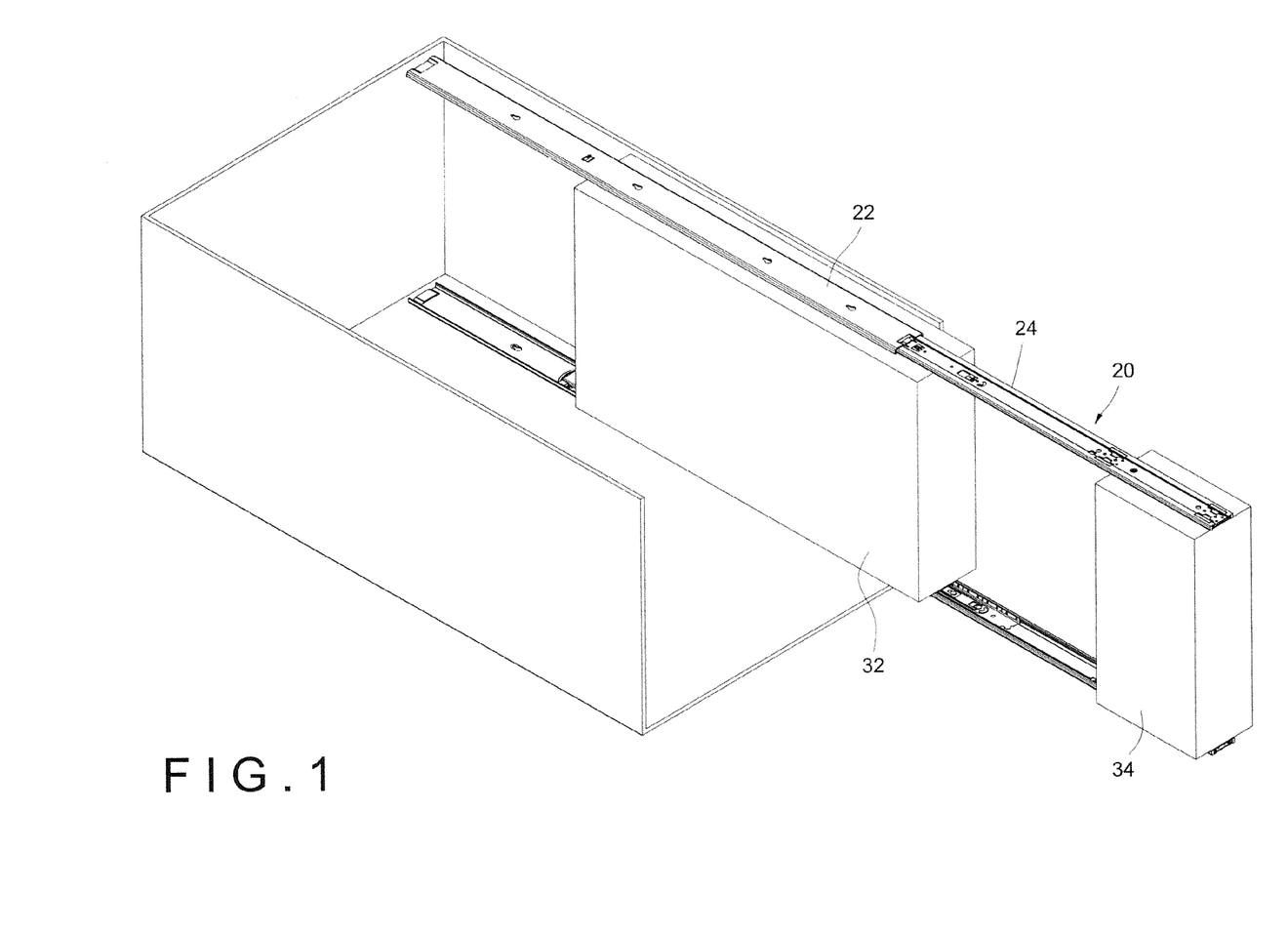
FIG. 1 is a schematic perspective view in which the slide rail assembly in an embodiment of the present invention has been pulled to an opened position along with two chassis.
Figure 2:
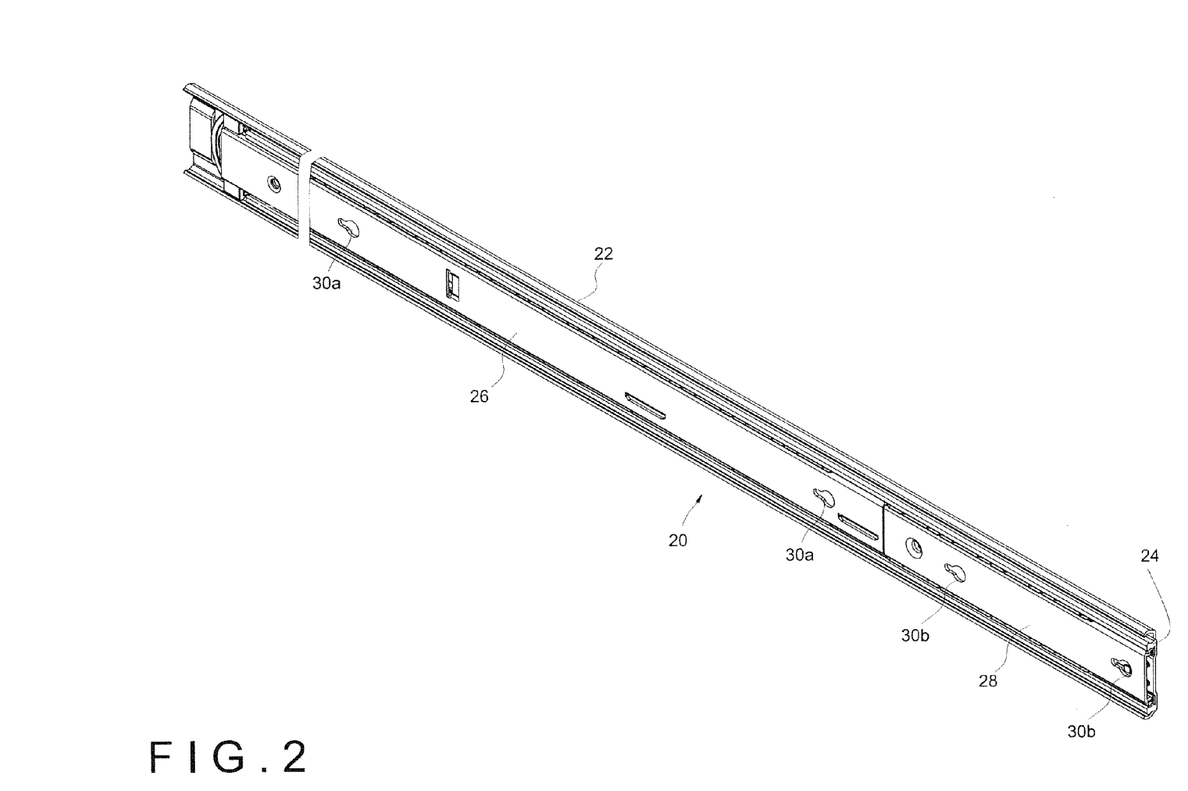
FIG. 2 is a schematic perspective view in which the slide rail assembly in an embodiment of the present invention is in a retracted position.

As shown in FIG. 1 and FIG. 2, the slide rail assembly 20 in an embodiment of the present invention is applicable to a server system. The slide rail assembly 20 includes a first rail 22, a second rail 24, a third rail 26, and an extension rail 28. The second rail 24 and the third rail 26 can be longitudinally displaced relative to the first rail 22. The third rail 26 has a plurality of mounting portions 30a. The extension rail 28 also has a plurality of mounting portions 30b. To apply the slide rail assembly 20 to the server system, a first chassis 32 (e.g., the chassis of a server) is mounted to the third rail 26 via the mounting portions 30a, and a second chassis 34 (e.g., the chassis of a storage device) is mounted to the extension rail 28 via the mounting portions 30b.

Figure 3:
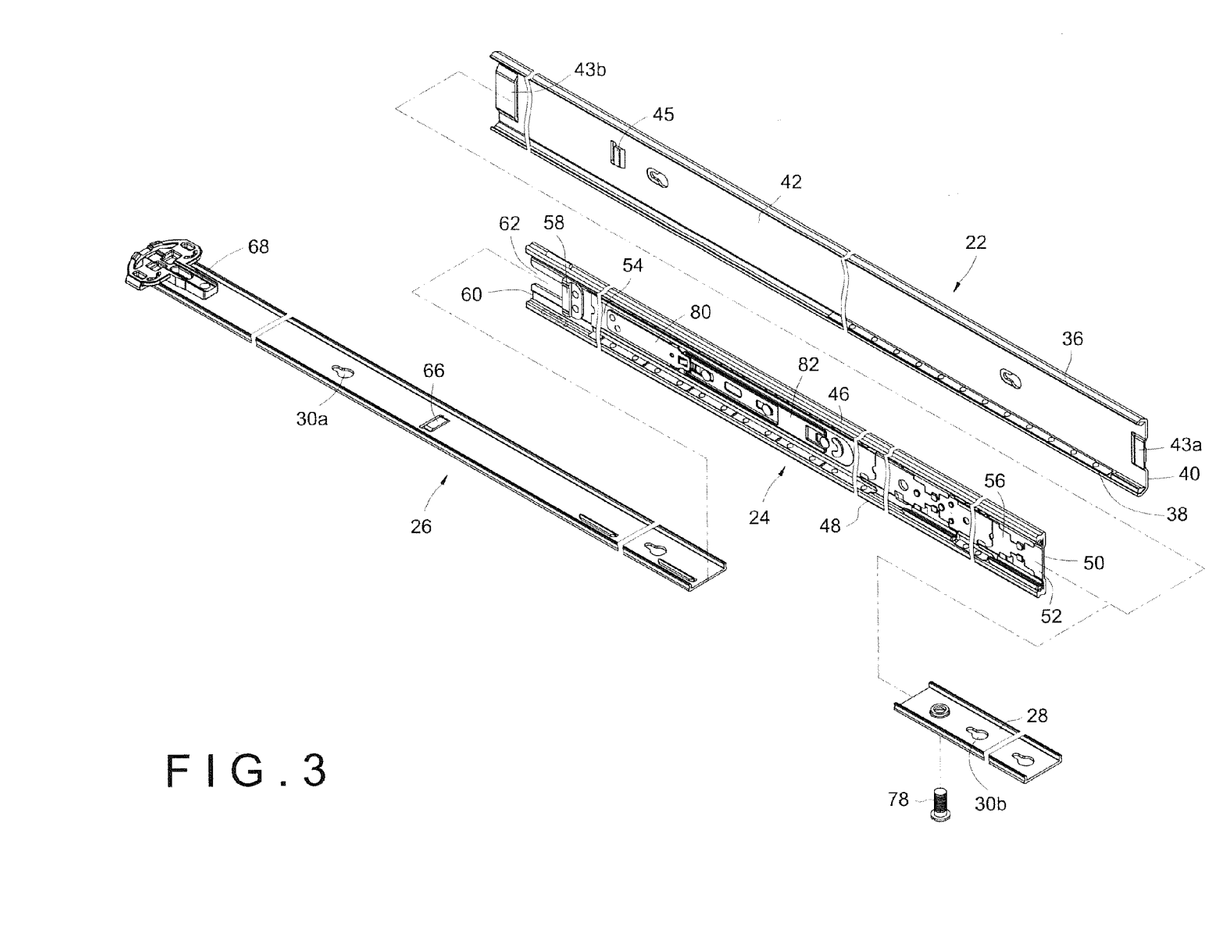
FIG. 3 is a schematic exploded view of the slide rail assembly in an embodiment of the present invention.
Figure 4:
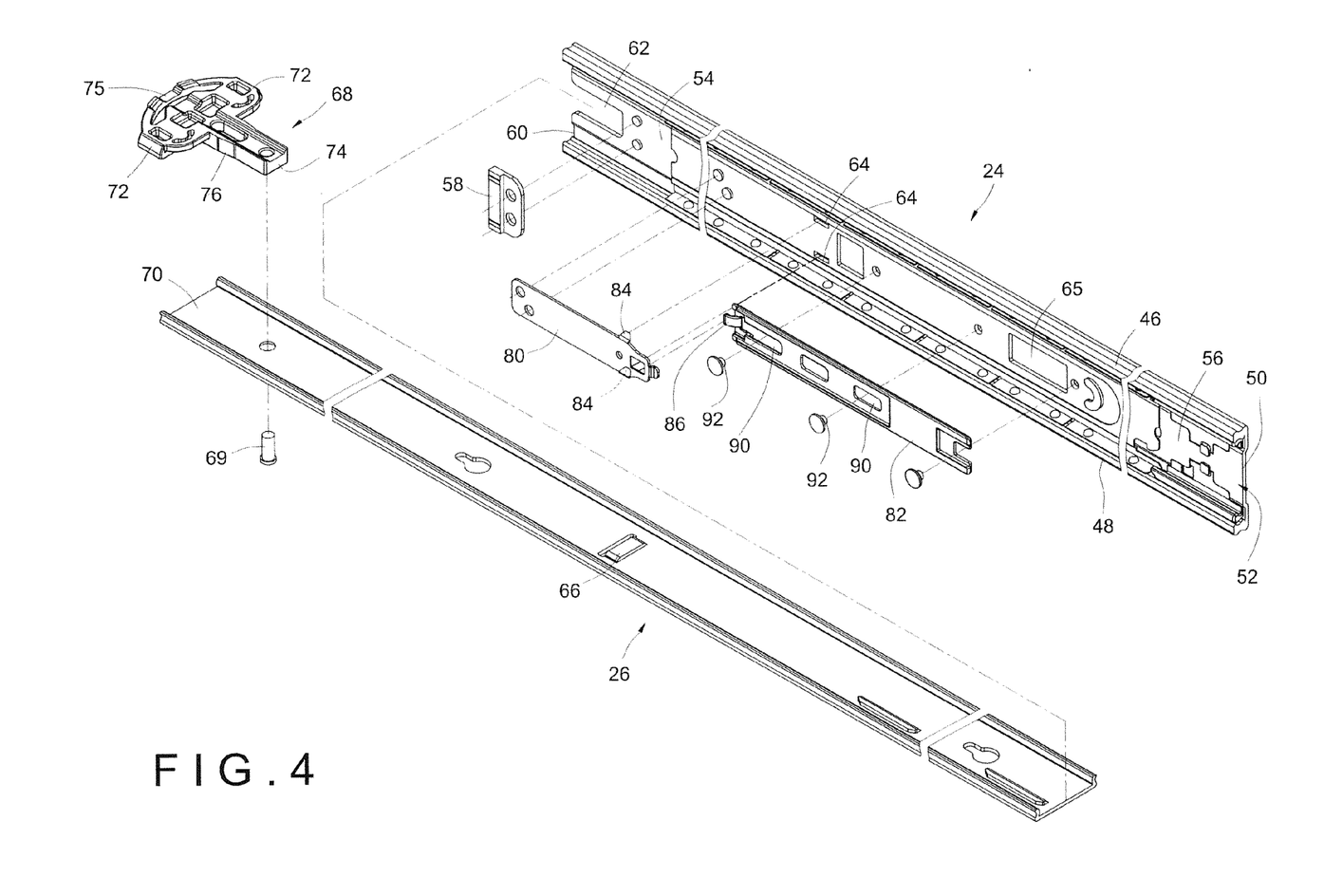
FIG. 4 is a schematic exploded view of the second rail and the third rail of the slide rail assembly in an embodiment of the present invention.

Referring to FIG. 3 and FIG. 4, the first rail 22 includes an upper wall 36, a lower wall 38, and a longitudinal main body 40 extending between the upper wall 36 and the lower wall 38. The upper wall 36, the lower wall 38, and the longitudinal main body 40 jointly define a channel 42. The longitudinal main body 40 is provided with a front blocking portion 43a and a rear blocking portion 43b at its front and rear ends respectively. In addition, a limiting feature 45 is provided between the front blocking portion 43a and the rear blocking portion 43b.

The second rail 24 corresponds to the channel 42 of the first rail 22. The second rail 24 includes an upper wall 46, a lower wall 48, and a longitudinal main body 50 extending between the upper wall 46 and the lower wall 48. The upper wall 46, the lower wall 48, and the longitudinal main body 50 jointly define a channel 52. The longitudinal main body 50 of the second rail 24 includes a first section 54 and a second section 56. The first section 54 is fixedly mounted with a base 58. The first section 54 is further provided with a recess 62 at an end portion 60. In addition, the first section 54 is provided with at least one engaging hole 64 and an aperture 65. In this embodiment, the second section 56 is shorter than the first section 54. In a non-shown embodiment of the present invention, however, the first section 54 and the second section 56 are equivalent in length. The present invention imposes no limitations in this respect.

The third rail 26 is correspondingly mounted to the channel 52 of the second rail 24 and is movably connected to the first section 54 of the second rail 24. The third rail 26 has a limiting feature 66 corresponding to the base 58.

The slide rail assembly 20 further includes a supporting member 68 which is fixedly connected by a fastener 69 to the third rail 26 at a position adjacent to an end portion 70 of the third rail 26. More specifically, the supporting member 68 has a pair of supporting wings 72, a pushing portion 74 between the supporting wings 72, a cushioning portion 75 opposite the pushing portion 74, and at least one engaging section 76 on a lateral side of the pushing portion 74.

The extension rail 28 is correspondingly mounted to the channel 52 of the second rail 24 and is located at the second section 56 of the second rail 24. The extension rail 28 is fixedly mounted to the second section 56 of the second rail 24 via a positioning element 78 so that the second rail 24 can be displaced relative to the first rail 22 by the extension rail 28. It is feasible, however, to mount the extension rail 28 to the second section 56 of the second rail 24 in a different way. For instance, the extension rail 28 can be so mounted that it is displaceable relative to the second rail 24 within a certain limit. Whichever the case may be, the point is for the second rail 24 to be driven by the extension rail 28.

Figure 11:
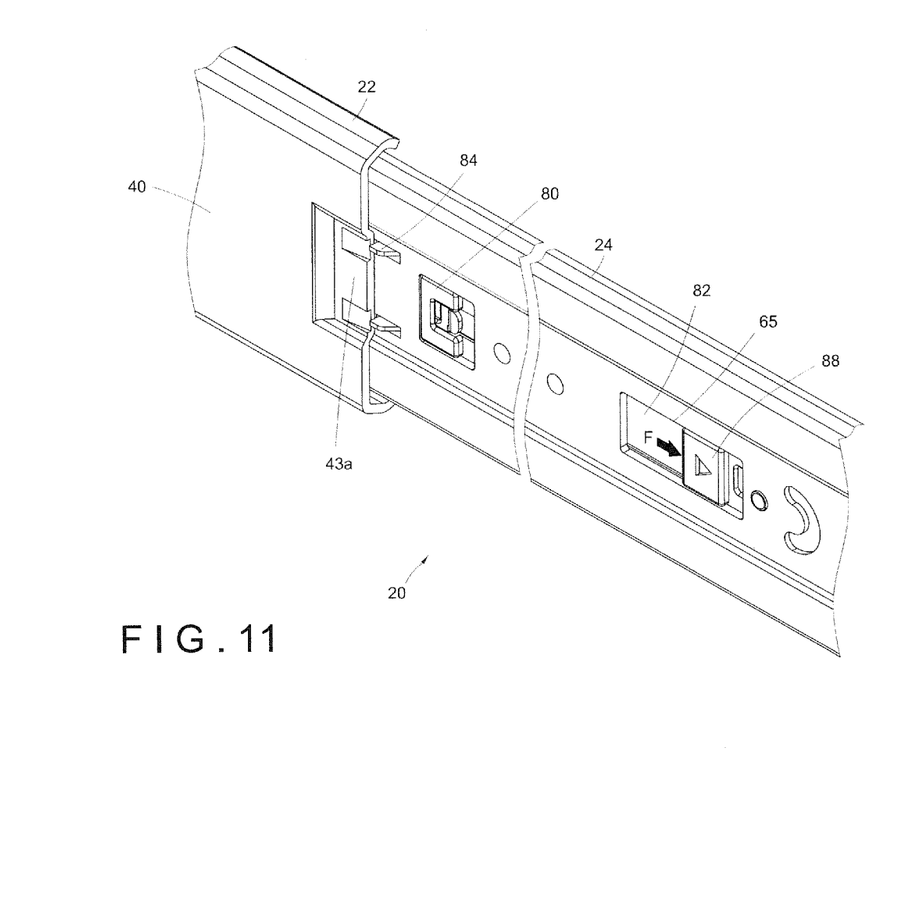
FIG. 11 is a schematic perspective view of the slide rail assembly in an embodiment of the present invention, in which the engaging projection of the engaging member is engaged with the front blocking portion of the first rail.

Preferably, the slide rail assembly 20 further includes an engaging member 80 and an operating member 82 operably connected to the engaging member 80. The engaging member 80 is elastically mounted to the first section 54 of the second rail 24. The engaging member 80 has at least one engaging projection 84 corresponding to the engaging hole 64 in the first section 54 of the second rail 24. The operating member 82 is longitudinally movably connected to the first section 54 of the second rail 24. In addition, at least one of the engaging member 80 and the operating member 82 has an inclined projection 86 which is inclined with respect to a longitudinal axis. In this embodiment, the inclined projection 86 is provided on the operating member 82. Preferably, as shown in FIG. 11, the operating member 82 has an operating portion 88 located at the aperture 65 of the second rail 24 to facilitate operation. More specifically, the operating member 82 is provided with at least one slot 90 and a guiding element 92. The guiding element 92 correspondingly passes through the slot 90 and is fixedly connected to the second rail 24 in order for the operating member 82 to be guided by the guiding element 92 and therefore displaced along the longitudinal axis when operated.

Figure 5:
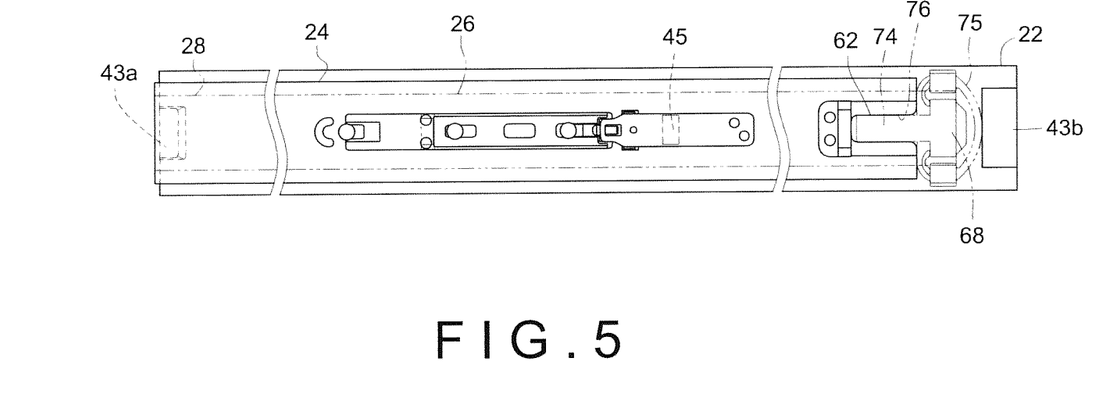
FIG. 5 is a schematic plan view in which the slide rail assembly in an embodiment of the present invention is in a retracted position.

FIG. 5 shows the second rail 24 and the third rail 26 at a retracted position relative to the first rail 22. At this position, the pushing portion 74 of the supporting member 68 is correspondingly inserted in the recess 62 of the second rail 24 while the engaging section 76 of the supporting member 68 is in engaging contact with the periphery of the recess 62 of the second rail 24. In addition, the cushioning portion 75 of the supporting member 68 serves to press against the rear blocking portion 43b of the first rail 22 so as to provide a cushioning effect and reduce the noise of impact when the third rail 26 is displaced to the retracted position relative to the first rail 22.

Figure 6:
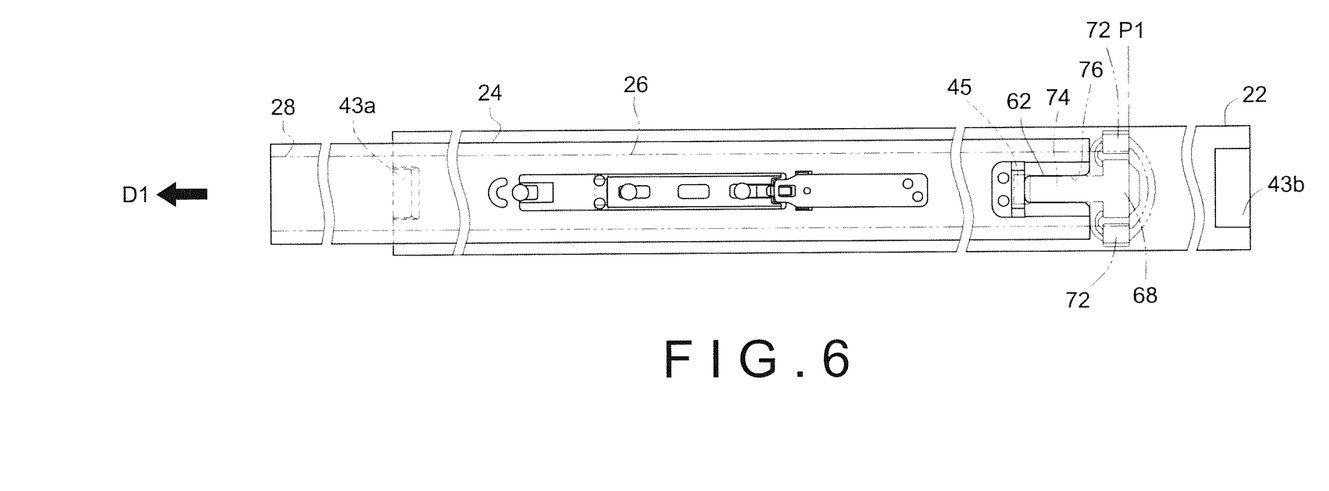
FIG. 6 is another schematic plan view of the slide rail assembly in FIG. 5, in which the third rail has been displaced to a first predetermined position along with the second rail.

Referring to FIG. 6, the second rail 24 is pulled in an opening direction D1 via the extension rail 28 so as to reach an extended position. As the second rail 24 is longitudinally displaced relative to the first rail 22, the third rail 26 is driven into longitudinal displacement relative to the first rail 22 by the second rail 24 due to the engaging contact between the engaging section 76 of the supporting member 68 and the periphery of the recess 62 of the second rail 24. Once the third rail 26 is displaced to a first predetermined position P1 relative to the first rail 22, the pushing portion 74 of the supporting member 68 is pressed against the limiting feature 45 of the first rail 22 such that the third rail 26 is retained at the first predetermined position P1. Besides, in the course in which the third rail 26 is displaced relative to the first rail 22, the supporting wings 72 of the supporting member 68 are pressed against the first rail 22 (e.g., the supporting wings 72 being pressed against the upper and lower walls of the first rail 22 respectively) to provide further support.

Figure 7:
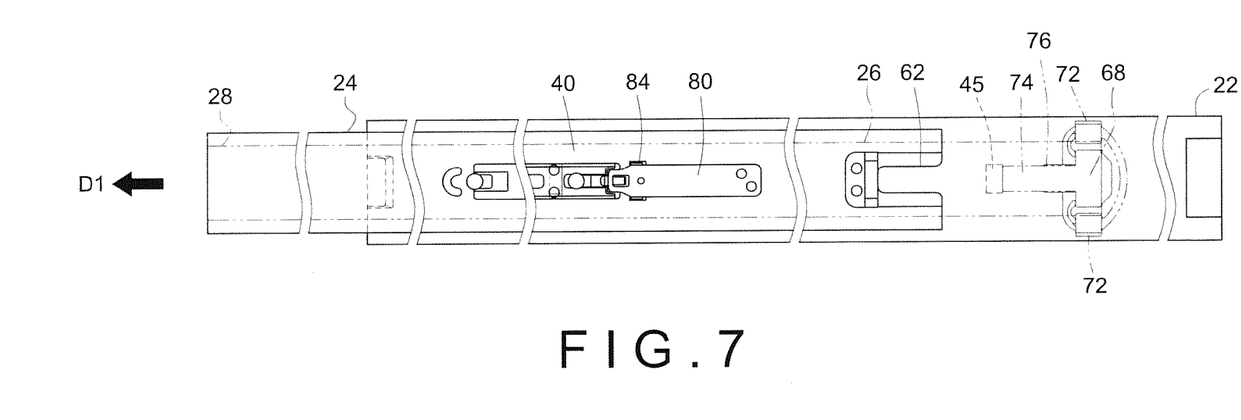
FIG. 7 is yet another schematic plan view of the slide rail assembly in FIG. 5, in which the second rail is further displaced outward while the third rail stays at the first predetermined position.

FIG. 7 shows how the recess 62 of the second rail 24 is separated from the engaging section 76 of the supporting member 68 when the second rail 24 is further displaced in the opening direction D1.

Figure 8:
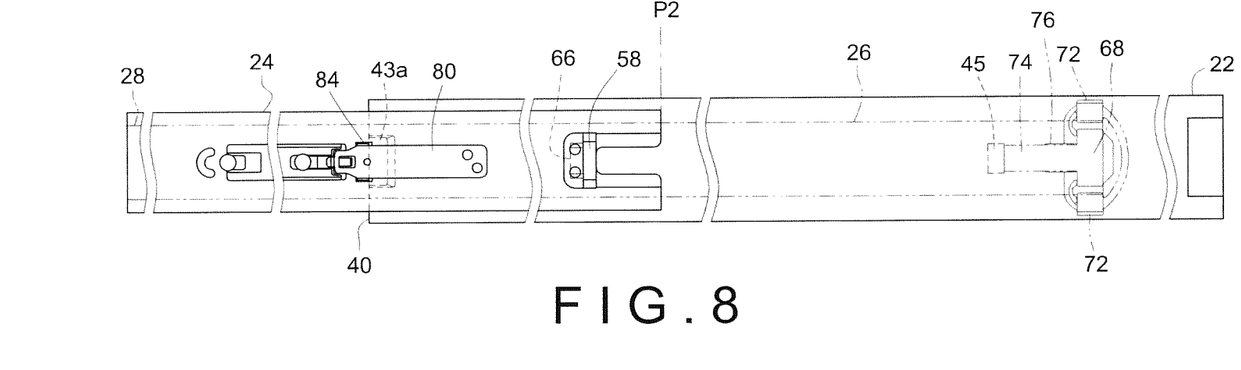
FIG. 8 is still another schematic plan view of the slide rail assembly in FIG. 5, in which the second rail has been displaced to a second predetermined position relative to the first rail.

In FIG. 8, the second rail 24 has been displaced to a second predetermined position P2 relative to the first rail 22. The base 58 of the second rail 24 is now pressed against the limiting feature 66 of the third rail 26 and thereby retains the second rail 24 at the second predetermined position P2.

Figure 9A:
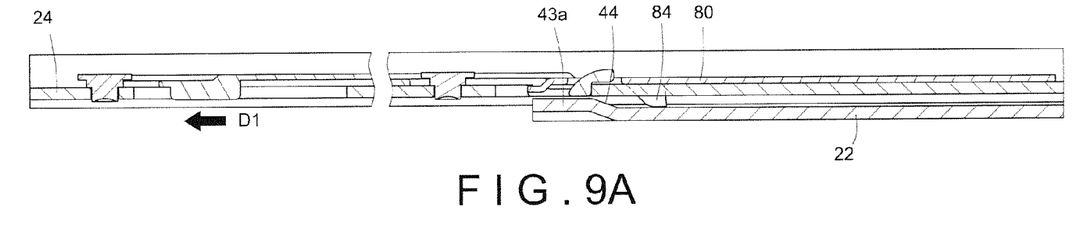
FIG. 9A is a schematic sectional view showing the second rail of the slide rail assembly in an embodiment of the present invention being displaced relative to the first rail, in which the engaging projection of the engaging member has been displaced to a position adjacent to the front blocking portion of the first rail.
Figure 9B:
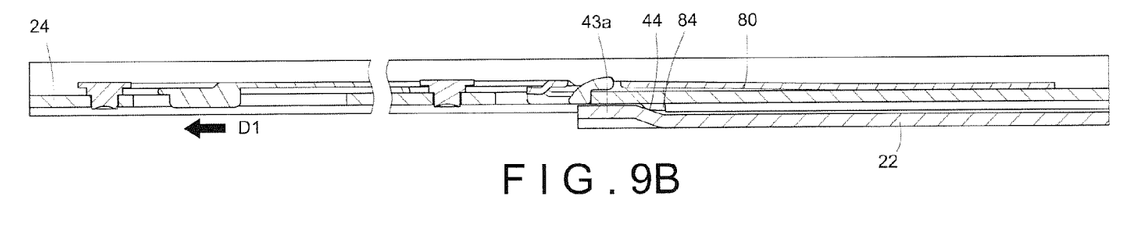
FIG. 9B is another schematic sectional view of the first and the second rails in FIG. 9A, in which the engaging projection of the engaging member is pressed against the inclined surface of the front blocking portion of the first rail.
Figure 9C:
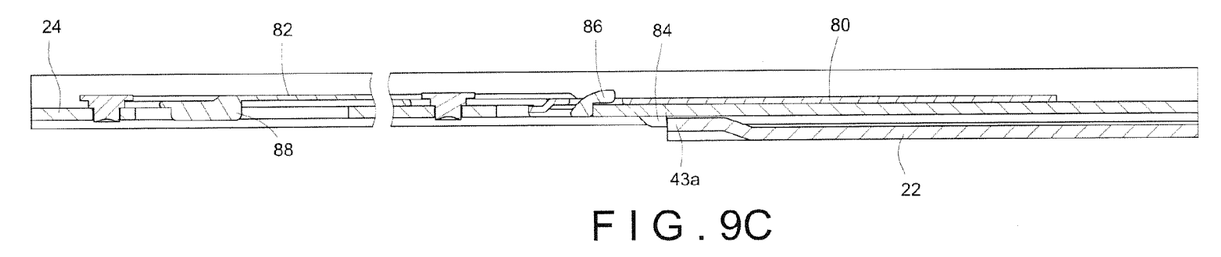
FIG. 9C is still another schematic sectional view of the first and the second rails in FIG. 9A, in which the engaging projection of the engaging member has moved past, and is engaged with, the front blocking portion of the first rail.
Figure 10:
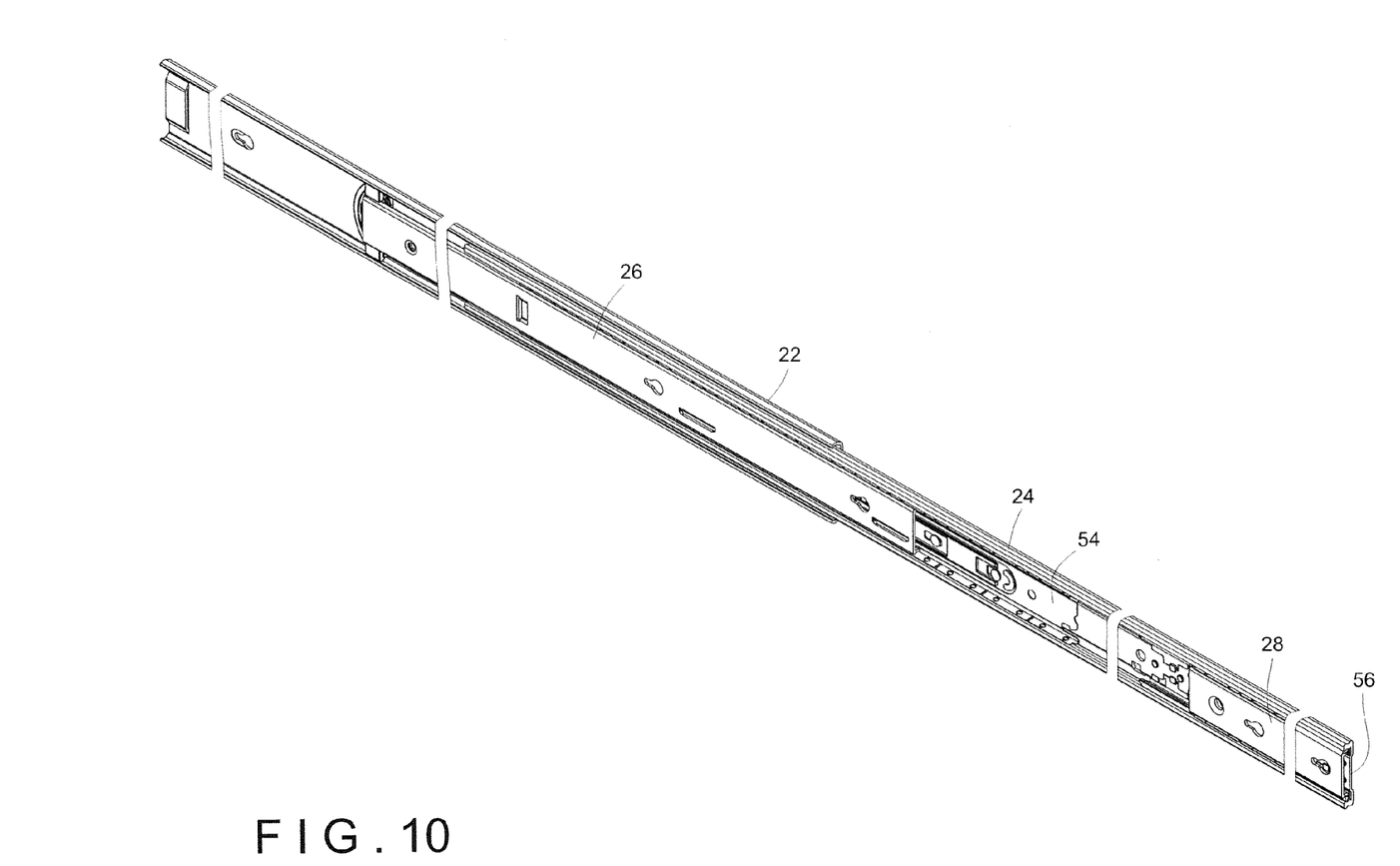
FIG. 10 is a schematic perspective view in which the slide rail assembly in an embodiment of the present invention is in an opened position where the slide rail assembly is extended to the greatest extent.

FIG. 9A to FIG. 9C show the process in which the second rail 24 is displaced (i.e., pulled out) relative to the first rail 22. When the engaging projection 84 of the engaging member 80 is displaced to a position corresponding to the front blocking portion 43a of the first rail 22, the engaging projection 84 of the engaging member 80 generates an elastic force in response to contact with an inclined surface 44 of the front blocking portion 43a. Once moved past the front blocking portion 43a of the first rail 22, the engaging projection 84 of the engaging member 80 releases the elastic force and ends up engaged with the front blocking portion 43a of the first rail 22 (i.e., the engaging member 80 being at an engaged position). The slide rail assembly 20 in this state is in an opened position where it is extended to the greatest extent (see FIG. 10).

It can be known from the above that, in the foregoing embodiment of the present invention, the first section 54 and the second section 56 of the second rail 24 are respectively provided with the third rail 26 and the extension rail 28 so as to connect with the first chassis 32 and the second chassis 34 respectively (see FIG. 1). Thereby the second rail 24 can be displaced relative to the first rail 22 by the second chassis 34. Further, the third rail 26 and the extension rail 28 are so designed that they are spaced apart when pulled beyond a predetermined position, thereby solving the problem in the prior art that the complexity of the cables in the chassis of a server and its storage device and the narrow space therein tend to hinder cable disconnection and component replacement.

Figure 12:
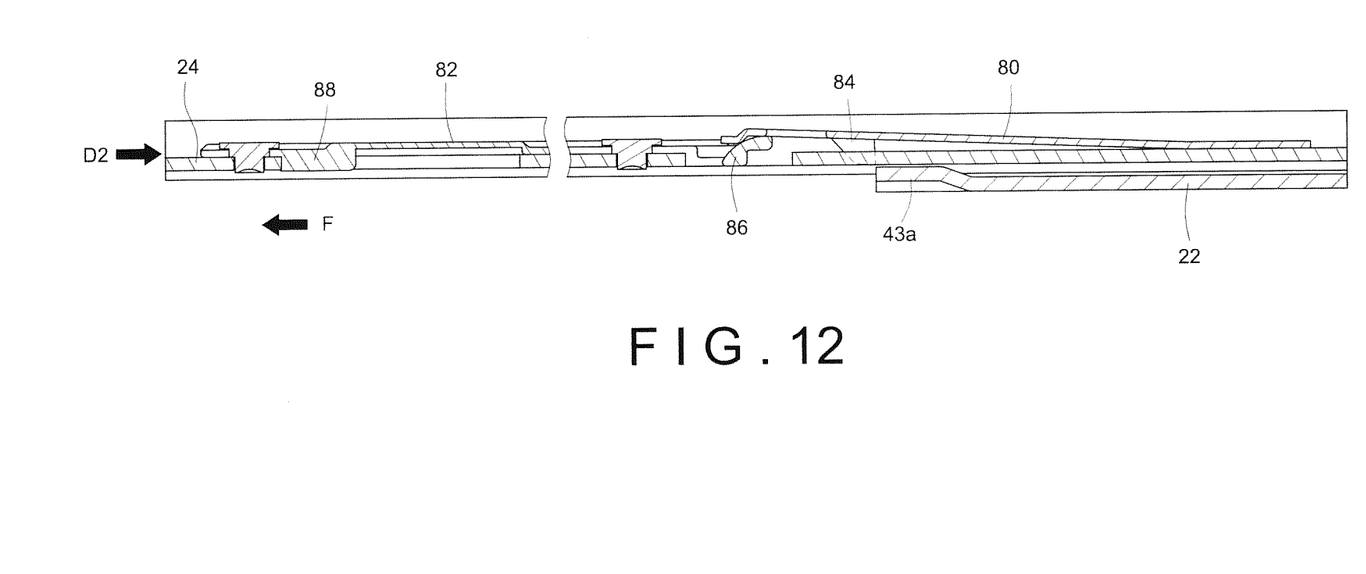
FIG. 12 is a schematic sectional view of the slide rail assembly in an embodiment of the present invention, showing how the engaging projection of the engaging member is disengaged from the front blocking portion of the first rail by operating the operating member.

Referring to FIG. 11 and FIG. 12, in order to displace and thereby retract the slide rail assembly 20 in a retracting direction D2 from the aforesaid opened position, a force F is applied to the operating portion 88 of the operating member 82 through the aperture 65 of the second rail 24. As a result, the inclined projection 86 of the operating member 82 pushes the engaging member 80 and thus lifts the engaging projection 84 of the engaging member 80 out of engagement with the front blocking portion 43a of the first rail 22, allowing the second rail 24 and the third rail 26 to be displaced in the retracting direction D2 to the retracted position shown in FIG. 2 and FIG. 5.

While the present invention has been disclosed by way of the preferred embodiments described above, those embodiments are not intended to be restrictive of the invention. The scope of patent protection sought is defined by the appended claims.

The invention claimed is:

1. A slide rail assembly comprising:
   a first rail;
   a second rail longitudinally displaceable relative to the first rail, the second rail including a first section and a second section;
   a third rail movably connected to the first section of the second rail and longitudinally displaceable relative to the first rail by the second rail;
   an extension rail located at the second section of the second rail; and
   a supporting member connected to the third rail;
   wherein the second rail further includes a recess, and the supporting member has a pushing portion to be inserted into the recess; and
   wherein the supporting member further has a cushioning portion opposite the pushing portion, and the first rail further includes a rear blocking portion so that, when displaced to a retracted position relative to the first rail, the third rail is pressed against the rear blocking portion of the first rail via the cushioning portion of the supporting member.

2. The slide rail assembly of claim 1, further including a supporting member connected to the third rail, the supporting member having at least one engaging section for making engaging contact with the second rail so that the third rail is longitudinally displaceable relative to the first rail by the second rail.

3. The slide rail assembly of claim 1, wherein the pushing portion of the supporting member has a side provided with at least one engaging section for making engaging contact with the recess so that the third rail is longitudinally displaceable relative to the first rail by the second rail.

4. The slide rail assembly of claim 1, wherein the first rail further includes a limiting feature so that, when the third rail has been displaced by the second rail to a first predetermined position relative to the first rail, the pushing portion of the supporting member is pressed against the limiting feature of the first rail and thereby retains the third rail at the first predetermined position.

5. The slide rail assembly of claim 1, further including an engaging member elastically mounted to the first section of the second rail, the engaging member including at least one engaging projection, the first rail further including a front blocking portion so that, when the second rail has been pulled out relative to the first rail to a position, the engaging projection of the engaging member is engaged with the front blocking portion of the first rail.

6. The slide rail assembly of claim 1, further including a positioning element for mounting the extension rail to the second section of the second rail so that the second rail is displaceable relative to the first rail via the extension rail.

7. A slide rail assembly comprising:
a first rail;
a second rail longitudinally displaceable relative to the first rail, the second rail including a first section and a second section;
a third rail movably connected to the first section of the second rail and longitudinally displaceable relative to the first rail by the second rail;
an extension rail located at the second section of the second rail; and
a supporting member connected to the third rail, the supporting member having a pair of supporting wings to be pressed against the first rail.

8. A slide rail assembly comprising:
a first rail;
a second rail longitudinally displaceable relative to the first rail, the second rail including a first section and a second section;
a third rail movably connected to the first section of the second rail and longitudinally displaceable relative to the first rail by the second rail;
an extension rail located at the second section of the second rail; and
a base mounted to the first section of the second rail, the third rail further including a limiting feature so that, when the second rail has been displaced to a second predetermined position relative to the first rail, the base of the second rail is pressed against the limiting feature of the third rail and thereby retains the second rail at the second predetermined position.

9. A slide rail assembly comprising:
a first rail;
a second rail longitudinally displaceable relative to the first rail, the second rail including a first section and a second section;
a third rail movably connected to the first section of the second rail and longitudinally displaceable relative to the first rail by the second rail;
an extension rail located at the second section of the second rail;
an engaging member elastically mounted to the first section of the second rail, the engaging member including at least one engaging projection, the first rail further including a front blocking portion so that, when the second rail has been pulled out relative to the first rail to a position, the engaging projection of the engaging member is engaged with the front blocking portion of the first rail; and
an operating member connected to the engaging member, the first section of the second rail having an aperture, the operating member having an operating portion located at the aperture so that, when the operating portion of the operating member is operated, the engaging projection of the engaging member is disengaged from the first rail.

10. The slide rail assembly of claim 9, wherein at least one of the operating member and the engaging member further has an inclined projection so that, by operating the operating member, the inclined projection is driven to push the engaging member and thereby disengage the engaging member from the first rail.

11. A slide rail assembly applicable to a first chassis and a second chassis, the slide rail assembly comprising:
a first rail;
a second rail longitudinally displaceable relative to the first rail, the second rail including a first section and a second section, the second section being connected with the second chassis, the second rail being displaceable relative to the first rail by the second chassis; and
a third rail movably connected to the first section of the second rail, the third rail being mounted with the first chassis, the third rail being longitudinally displaceable relative to the first rail by the second rail.

12. The slide rail assembly of claim 11, further including an extension rail located at the second section of the second rail, the second chassis being mounted to the extension rail.

13. The slide rail assembly of claim 11, wherein the second rail further includes a recess, the slide rail assembly further includes a supporting member connected to the third rail, and the supporting member has a pushing portion to be inserted into the recess.

14. The slide rail assembly of claim 13, wherein the pushing portion of the supporting member has a side provided with at least one engaging section for making engaging contact with the recess so that the third rail is longitudinally displaceable relative to the first rail by the second rail.

15. The slide rail assembly of claim 13, wherein the first rail further includes a limiting feature so that, when the third rail has been displaced by the second rail to a first predetermined position relative to the first rail, the pushing portion of the supporting member is pressed against the limiting feature of the first rail and thereby retains the third rail at the first predetermined position.

16. The slide rail assembly of claim 11, further including a supporting member connected to the third rail, the supporting member having a pair of supporting wings to be pressed against the first rail.

17. The slide rail assembly of claim 11, further including a base mounted to the first section of the second rail, the third rail further including a limiting feature so that, when the second rail has been displaced to a second predetermined position relative to the first rail, the base of the second rail is pressed against the limiting feature of the third rail and thereby retains the second rail at the second predetermined position.

18. The slide rail assembly of claim 11, further including an engaging member elastically mounted to the first section of the second rail, the engaging member including at least one engaging projection, the first rail further including a front blocking portion so that, when the second rail has been pulled out relative to the first rail to a position, the engaging projection of the engaging member is engaged with the front blocking portion of the first rail.

* * * * *